United States Patent
Bonnet et al.

(10) Patent No.: US 10,050,229 B2
(45) Date of Patent: Aug. 14, 2018

(54) ENCAPSULATION OF AN ORGANIC OPTOELECTRONIC COMPONENT

(71) Applicant: COMMISSARIAT A L'ENERGIE ATOMIQUE ET AUX ENERGIES ALTERNATIVES, Paris (FR)

(72) Inventors: Robin Bonnet, Grenoble (FR); Jean-Marc Gilet, Fontaine (FR); Tony Maindron, Grenoble (FR); Jean-Yves Simon, Fontaine (FR)

(73) Assignees: COMMISSARIAT A L'ENERGIE ATOMIQUE ET AUX ENERGIES ALTERNATIVES, Paris (FR); MICROOLED, Grenoble (FR)

(*) Notice: Subject to any disclaimer, the term of this patent is extended or adjusted under 35 U.S.C. 154(b) by 0 days.

(21) Appl. No.: 15/323,943

(22) PCT Filed: Jul. 8, 2015

(86) PCT No.: PCT/EP2015/065616
§ 371 (c)(1),
(2) Date: Jan. 4, 2017

(87) PCT Pub. No.: WO2016/005456
PCT Pub. Date: Jan. 14, 2016

(65) Prior Publication Data
US 2017/0141354 A1    May 18, 2017

(30) Foreign Application Priority Data

Jul. 9, 2014  (FR) ..................... 14 56626

(51) Int. Cl.
| | |
|---|---|
| *H01L 51/52* | (2006.01) |
| *H01L 51/44* | (2006.01) |
| *H01L 51/56* | (2006.01) |
| *H01L 45/00* | (2006.01) |
| *H01L 21/02* | (2006.01) |

(52) U.S. Cl.
CPC ........ *H01L 51/5256* (2013.01); *H01L 51/448* (2013.01); *H01L 51/56* (2013.01);
(Continued)

(58) Field of Classification Search
CPC ... H01L 51/5256; H01L 51/448; H01L 51/56; H01L 45/1233; H01L 45/146; H01L 45/08; H01L 45/145; H01L 2/02281
See application file for complete search history.

(56) References Cited

U.S. PATENT DOCUMENTS

| | | |
|---|---|---|
| 6,198,220 B1 | 3/2001 | Jones et al. |
| 7,193,364 B2 | 3/2007 | Klausmann et al. |

(Continued)

FOREIGN PATENT DOCUMENTS

| | | |
|---|---|---|
| EP | 2 055 734 A2 | 5/2009 |
| EP | 2 136 423 A1 | 12/2009 |

(Continued)

OTHER PUBLICATIONS

Byoung Duk Lee et al., "Effect of transparent film desiccant on the lifetime of top-emitting active matrix organic light emitting diodes," Applied Physics Letters, vol. 90, pp. 103518-1-103518-3, (2007).

*Primary Examiner* — Nicholas Tobergte
(74) *Attorney, Agent, or Firm* — Baker & Hostetler LLP

(57) ABSTRACT

An encapsulated device comprises: an organic optoelectronic component exhibiting at least one sensitive surface protected from oxygen and/or water vapor; and a multilayer encapsulation structure covering the sensitive surface, comprising at least one layer made of organic material interposed between first and second barrier layers made of nonmetallic inorganic material impermeable to oxygen and water vapor; wherein the barrier layers are made of a material chosen from a stoichiometric metal oxide, stoichiometric silicon oxide and a silicon oxynitride and produced by atomic layer (Continued)

deposition, and wherein the multilayer encapsulation structure also comprises at least one active layer containing a nonstoichiometric oxide exhibiting an oxygen deficiency, also interposed between the first and said second barrier layers. A process for encapsulating a component exhibiting a "sensitive" surface protected from oxygen and/or water vapor by producing a multilayer encapsulation structure is provided.

12 Claims, 2 Drawing Sheets

(52) U.S. Cl.
CPC .......... *H01L 21/0228* (2013.01); *H01L 45/08* (2013.01); *H01L 45/1233* (2013.01); *H01L 45/145* (2013.01); *H01L 45/146* (2013.01)

(56) References Cited

U.S. PATENT DOCUMENTS

| | | | |
|---|---|---|---|
| 2007/0273280 A1* | 11/2007 | Kim | H01L 51/5237 313/509 |
| 2013/0049580 A1* | 2/2013 | Maindron | H01L 51/5256 313/512 |
| 2014/0124767 A1 | 5/2014 | Maindron et al. | |
| 2015/0014823 A1* | 1/2015 | Mallikarjunan | C23C 16/402 257/632 |

FOREIGN PATENT DOCUMENTS

| | | |
|---|---|---|
| FR | 2 958 795 A1 | 10/2011 |
| FR | 2 973 941 A1 | 10/2012 |
| WO | 00/36665 A1 | 6/2000 |
| WO | 2011/128802 A1 | 10/2011 |

* cited by examiner

ENCAPSULATION OF AN ORGANIC OPTOELECTRONIC COMPONENT

CROSS-REFERENCE TO RELATED APPLICATIONS

This application is a National Stage of International patent application PCT/EP2015/065616, filed on Jul. 8, 2015, which claims priority to foreign French patent application No. FR 1456626, filed on Jul. 9, 2014, the disclosures of which are incorporated by reference in their entirety.

FIELD OF THE INVENTION

The invention relates to the encapsulation of an organic optoelectronic component exhibiting at least one "sensitive" surface which has to be protected from oxygen and/or moisture (water vapor). More particularly, the invention relates to an encapsulated device comprising such a component and to a multilayer encapsulation structure covering at least said sensitive surface, and also to a process for the encapsulation of such a component.

BACKGROUND

In a known way, many electrical and optoelectronic components—in particular but not exclusively those based on organic materials—have to be encapsulated in order to ensure the protection of their sensitive components from oxygen and water vapor. This is the case, for example, with organic light-emitting diodes ("OLED") and organic photovoltaic cells ("OPVs"). If this protection is not correctly ensured, degradation of the devices, which can result in their failure, takes place. For example, in the case of OLED screens, nonemissive black spots appear, which spots are caused by the degradation, induced by water vapor, of the interface between the anode and/or of the cathode and the thin organic layers.

The simplest encapsulation method for devices sensitive to water and oxygen consists in adhesively bonding a glass cover over the top of said devices, under an inert atmosphere, and in sealing this cover with an epoxy adhesive, for example. As a result of the impossibility of guaranteeing a perfect atmosphere inside the cover and as a result of the lateral permeation through the sealing, this technology is not sufficient. This is why a getter material—that is to say a material which absorbs moisture and/or gas—is typically introduced within this cover. The getter can, for example, be a zeolite, a metal or an oxide, such as CaO or BaO. For example, the document U.S. Pat. No. 7,193,364 describes an encapsulation by an adhesively bonded cover in which the getter form a bead surrounding the component to be protected.

However, the use of a rigid cover as encapsulation means exhibits numerous disadvantages: complex to operate industrially, limitation of the processes which can be carried out after the encapsulation (for example, deposition of colored filters), functional incompatibility (for example for flexible devices) or optical incompatibility (emission through the getter). For example, in the context of top emission OLED (TE-OLED) screens, it is not appropriate to use an encapsulation by a cover as the encapsulation has to be the most transparent possible and the least bulky possible. Furthermore, in the context of flexible screens, this encapsulation has itself also to be flexible. This is why use is preferably made of encapsulation barriers comprising thin layers. "Thin layers" is understood here to mean layers with a thickness of less than or equal to 10 μm, more advantageously less than or equal to 5 μm and preferably less than or equal to 1 μm. Furthermore, advantageously, the thickness of a thin encapsulation layer should not be greater than 15% and preferably than 10% of the smallest lateral dimension of a pixel or a subpixel.

The best thin-layer encapsulations, known under the name of "SHB barriers" (SHB standing for Super-High Barriers), consist of "dyads", that is to say alternations of inorganic layers (typically oxides) and organic layers. The inorganic layers can be obtained by chemical vapor deposition (CVD), physical vapor deposition (PVD) or atomic layer deposition (ALD), whereas the organic layers can be obtained by CVD, PVD, inkjet printing or spin coating.

In these structures, the oxide acts as impermeable barrier to oxygen and to moisture (water vapor). The organic material is used, on the one hand, to decorrelate the defects between two oxide layers (that is to say, to ensure that a defect present in a lower layer does not spread to an upper layer during the deposition of the latter) and, on the other hand, to lengthen the diffusion path between the defects of two successive layers of oxides. The first organic layer is assumed to have a beneficial effect on the density of defects of the successive layers as it also has a planarization function. See, for example, the documents WO 2000/036665 and WO 2011128802.

Similarly, the document EP 2 136 423 describes an organic optoelectronic component provided with a multilayer encapsulation structure comprising two layers based on perfluorohexane ($C_6F_6$), between which are arranged a polymer layer and a layer based on $SiO_x$.

Generally, the more the number of dyads is increased, the more the protective quality of the barrier is improved. However, there are disadvantages to increasing the number of dyads present: increased manufacturing time, difficulty in making contacts, loss of yield and filtering of the colors in the case of OLEDs, and the like.

Furthermore, it is impossible to obtain inorganic barrier layers which are truly devoid of defects (inclusive particles, pinholes and sometimes microcracks). Thus, even if the intrinsic properties of the barriers are excellent, at the location of the defects, the rates of penetration of water and oxygen are very markedly accelerated. The organic layers make it possible to delay the failure of the device (increased diffusion path and defects in the first barrier decorrelated with a possible defect in a second barrier); however, the appearance of a local defect of the OLED is accelerated and, in some cases, it is possible to consider that each defect of a barrier layer results, in the end, in complete failure.

The document U.S. Pat. No. 6,198,220 describes an encapsulation structure comprising a dielectric barrier layer protected by a metal layer. The latter is "self-repairing" in the sense that it reacts with water vapor and/or oxygen so that it automatically reblocks any defect of "pinhole" type. This solution is not very suitable for TE-OLEDs and for organic photovoltaic cells which have to be illuminated via their upper face due to the use of metal layers, even if the latter are sufficiently thin to be partially transparent.

Another method of thin-layer encapsulation known from the prior art consists in using a getter in the form of a thin layer sandwiched between two barrier layers, in order to capture the water which has diffused through the defects of the upper barrier. See, for example, the paper by Byoung Duk Lee et al., "Effect of transparent film desiccant on the lifetime of top-emitting active matrix organic light emitting diodes", Applied Physics Letters, 90, 103518 (2007).

In accordance with the prior art, use is made, as getter, either of metals, such as Ca, Sr or Ba, or of oxides or sulfides of these metals: CaO, CaS, SrO, SrS, BaO or BaS. These solutions all exhibit disadvantages:

The metals have the major disadvantage of having an effect on the optical properties of the barrier, which is not acceptable, for example in the context of top emission OLED microdisplays.

The oxides and sulfides have the disadvantage of reacting with the water but not with the oxygen and thus do not make possible complete protection of the device. Furthermore, the sulfides produce, on reacting with the water, hydrogen sulfide, which is a malodorous and highly toxic gas.

The document U.S. 2007/0273280 describes an encapsulation structure comprising an alternation of dyads each formed by an organic buffer layer and an "active" barrier layer made of activated metal oxide or oxynitride (that is to say, comprising oxygen deficiencies) capable of absorbing the water via a chemical reaction.

The invention is targeted at overcoming the abovementioned disadvantages of the prior art. More particularly, it is targeted at providing a thin encapsulation barrier (thickness of the order of a few micrometers, preferably 1 μm or less) which exhibits a low rate of failure (advantageously lower than that of the SHB barriers of the prior art), is transparent (transmittance of greater than or equal to 90%) and provides effective protection just as well against water vapor as oxygen. Advantageously, such an encapsulation barrier should be compatible with the preparation of a flexible device and with the addition of functional layers (for example: optical filters) above the encapsulation, not appreciably disrupt the passage of light and/or be easy to produce in an industrial environment with a high output.

In accordance with the invention, this aim is achieved by the use of a multilayer encapsulation structure comprising at least one "active" layer interposed between nonmetallic inorganic barrier layers which are impermeable to oxygen and to water vapor. The barrier layers are made of a stoichiometric metal oxide, stoichiometric silicon oxide ($SiO_2$) or a silicon oxynitride ($SiN_xO_y$) by atomic layer deposition (ALD). This technique makes it possible to obtain dense stoichiometric layers with only a few defects of "pinhole" type. The active layers consist of (or, in any case, contain) at least one nonstoichiometric oxide exhibiting a shortage of oxygen, for example $SiO_x$ with x less than 2 and typically x close to 1 (for example $0.8 \leq x \leq 1.2$). These oxides capture the oxygen or the water vapor which has crossed an upper barrier layer, typically because of the presence of point defects or pinholes, and react with them, forming stoichiometric oxides, the barrier quality of which makes it possible to compensate, at least in part, for the failure of the upper barrier layer. Furthermore, the reaction of a nonstoichiometric oxide exhibiting an oxygen deficiency with water vapor, $H_2O$, produces gaseous molecular hydrogen $H_2$ which creates a local excess pressure. It is assumed that this excess pressure can have the effect of causing the molecular hydrogen to diffuse through the defect or defects of the barrier layer which covers the active layer while entraining with it the water vapor and the oxygen which have been able to enter therein.

SUMMARY OF THE INVENTION

Thus, a subject matter of the invention is an encapsulated device comprising:

an organic optoelectronic component exhibiting at least one surface, called sensitive surface, which has to be protected from oxygen and/or from water vapor; and a multilayer encapsulation structure covering at least said sensitive surface, comprising at least one layer made of organic material interposed between a first and a second barrier layer made of nonmetallic inorganic material impermeable to oxygen and to water vapor;

characterized in that:

said barrier layers are made of a material chosen from a stoichiometric metal oxide, stoichiometric silicon oxide and a silicon oxynitride and produced by atomic layer deposition, and in that:

said multilayer encapsulation structure also comprises at least one layer, called active layer, containing a nonstoichiometric oxide exhibiting an oxygen deficiency, also interposed between said first and said second barrier layer.

According to different embodiments of such a device:

Said active layer can be deposited on said organic layer.

Said multilayer encapsulation structure can comprise a plurality of active layer-barrier layer pairs, produced above said first barrier layer, the structure terminating in said second barrier layer.

Said multilayer encapsulation structure can be substantially transparent to visible light.

Said active layer can contain a nonstoichiometric oxide exhibiting an oxygen deficiency of between 40% and 60%.

Said active layer can contain at least one nonstoichiometric oxide exhibiting an oxygen deficiency chosen from: $SiO_x$ with $0 < x < 2$ and advantageously $0.8 \leq x \leq 1.2$; and $MoO_x$ with $0 < x < 3$.

Said component can be chosen from an organic light-emitting diode and an organic photovoltaic cell, be deposited on a substrate and comprise an active region, said sensitive surface being a surface of said active region being positioned on the opposite side from said substrate.

Another subject matter of the invention is a process for the encapsulation of an organic optoelectronic component exhibiting at least one surface, called sensitive surface, which has to be protected from oxygen and/or from water vapor, characterized in that it comprises the following stages:

a) producing, by atomic layer deposition, on or above said sensitive surface, a first barrier layer made of a nonmetallic inorganic material impermeable to oxygen and to water vapor, chosen from a stoichiometric metal oxide, stoichiometric silicon oxide and a silicon oxynitride;

b) depositing, on or above said first barrier layer, a stack of layers comprising at least one layer made of organic material and a layer, called active layer, containing a nonstoichiometric oxide exhibiting an oxygen deficiency; and c) producing, by atomic layer deposition, on or above said stack of layers, a second barrier layer made of nonmetallic inorganic material impermeable to oxygen and to water vapor, also chosen from a stoichiometric metal oxide, stoichiometric silicon oxide and a silicon oxynitride.

According to different embodiments of such a process:

Each of said steps a) and c) can comprise at least one operation for the deposition with at least one nonmetallic inorganic material impermeable to oxygen and to water vapor by a technique chosen from: chemical vapor deposition, physical vapor deposition; atomic layer deposition and cathode sputtering.

Said step b) can comprise an operation for the deposition of at least one nonstoichiometric oxide by a technique chosen from: plasma assisted chemical vapor deposition, physical vapor deposition and cathode sputtering.

Said component can be chosen from an organic light-emitting diode and an organic photovoltaic cell, be deposited on a substrate and comprise an active region, said sensitive surface being a surface of said active region positioned on the opposite side from said substrate, and also electrical contacts, said steps a) to c) being carried out by selective deposition operations so that said electrical contacts are not covered by said layers.

BRIEF DESCRIPTION OF THE DRAWINGS

Other characteristics, details and advantages of the invention will emerge on reading the description made with reference to the appended drawings given by way of example and which represent, respectively.

DETAILED DESCRIPTION

Figure 1:
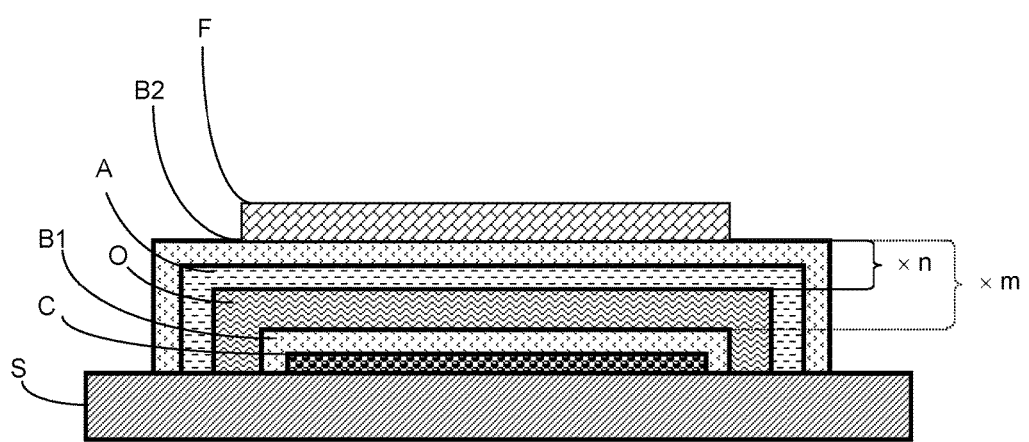
FIG. 1, a view in section of an encapsulated device according to a first embodiment of the invention.

FIG. 1 illustrates a device according to one embodiment of the invention provided in the form of a stack of thin layers—C, B1, O, A, B2 and F—on a substrate S.

The substrate S has to be suitable for the organic optoelectronic component C to be encapsulated; it can, for example, be a substrate made of silicon, of glass or a plastic in the case of a flexible device. The substrate can include, depending on the component, functions such as control electronics.

The component C, deposited on the substrate S, has to be encapsulated in order to be protected from air and water. It can in particular be an OLED, a microbattery or an organic photovoltaic cell (OPV). Subsequently, the case of an OLED, formed by a stack of thin organic layers confined between two inorganic conductive layers forming the anode and the cathode, will be considered.

Above the upper face (opposite the substrate) of the component C, there is a multilayer encapsulation structure comprising, in order:

A first barrier layer B1 impermeable to oxygen and to water vapor. This layer, which is inorganic and nonmetallic, can consist of (or more generally comprise) a stoichiometric metal oxide, such as $TiO_2$, $ZrO_2$, $Al_2O_3$, ZnO or $SnO_2$, stoichiometric silicon oxide $SiO_2$ or a silicon oxynitride $SiN_xO_y$. In the optical applications, this barrier material should advantageously be transparent. As indicated above, the layer B1 is deposited by ALD (atomic layer deposition). Its thickness depends on the constraints related to the component to be encapsulated. For example, 10-50 nm of alumina ($Al_2O_3$) can be used.

An organic planarization layer O, for example made of a material such as a (photosensitive or nonphotosensitive) resin, a polymer or a parylene, is subsequently deposited above the first barrier layer B1. This deposition can be carried out by spin coating, PVD, CVD, inkjet printing, and the like. The thickness of this organic layer O is limited by the constraints related to the component; it can, for example, be 50-500 nm in the case of an OLED microscreen. The organic planarization layer is generally necessary in order to compensate for the relief of the component to be protected, which is matched by the first barrier layer produced by ALD—a very conforming technique. The planarization makes it possible to ensure a better uniformity of the thickness of the layers deposited subsequently. Preferably, the organic layer O is deposited above the first barrier layer B1 in order not to degrade the component to be protected.

An "active" layer A consisting of (or more generally comprising) a deposited layer of at least one nonstoichiometric oxide, such as $SiO_x$ (0<x<2), $MoO_x$ or any other oxide comprising an oxygen deficiency. This deposited layer can be produced by any method of deposition under vacuum or under a controlled atmosphere, for example under nitrogen (it is particularly important to protect the active oxide from water vapor). Mention may be made, among the deposition methods capable of being used, of PA-CVD (plasma assisted chemical vapor deposition), PVD (physical vapor deposition) or cathode sputtering. The thickness of the deposited layer is dependent on the constraints related to the device (optical absorption, bulk, flexural strength or other constraints, and the like); it can, for example, be between 25 nm and 100 nm for OLED microscreens. The stoichiometry of the oxide (value of "x", that is to say oxygen content) can be controlled using a controlled atmosphere, for example by setting the oxygen partial pressure in the controlled atmosphere using a mass flow controller (MFC).

A second barrier layer B2 analogous to the abovementioned layer B1. The active layer A and incidentally the organic layer O ensure the decorrelation of the point defects of the barrier layers B1 and B2.

When the organic optoelectronic device has to emit or receive light through said encapsulation structure, the materials forming the different layers have to be chosen so that they are substantially transparent. This requirement presents a constraint with regard to the oxygen content of the nonstoichiometric oxide of the active layer. This is because, in many cases (and in particular in that of $SiO_x$), the more depleted in oxygen such an oxide is, the more it will absorb; conversely, the closer it is to a stoichiometric composition, the more transparent it will be—but the less capable it will be of reacting with $O_2$ and $H_2O$. It will thus be necessary to find a compromise between transparency and reactivity of the nonstoichiometric oxide, also taking into account its thickness. Typically, it will be possible to use oxides exhibiting an oxygen deficiency of between 20% or 25%—but preferably at least 40%—and 60%, with a total thickness (taking into account the possibility of having several active layers—see below) of between 20 and 100 nm. The oxygen deficiency D of an oxide $M_yO_x$ is given by: $(s-x)/s \cdot 100\%$, "s" being the value of the index "x" in the stoichiometric composition; for example, in the case of $SiO_{0.8}$, x=0.8 and s=2, which gives $D=(2-0.8)/2 \cdot 100=60\%$. In the case of $SiO_{1.5}$, $D=(2-1.5)/2 \cdot 100=25\%$. A good compromise between transparency and reactivity can be obtained, for example, with $SiO_x$ with $1 \le x \le 1.5$ or, preferably, $0.8 \le x \le 1.2$.

It will be noted that the multilayer encapsulation structure of FIG. 1 differs from a known SHB encapsulation of the prior art essentially by the introduction of the active layer A into the space between the first barrier layer B1 (internal barrier layer) and the second barrier layer B2 (external barrier layer).

In the case of FIG. 1, the organic layer O is deposited between the first barrier layer and the active layer A, and the second barrier layer B2 is deposited directly on the latter. However, other possibilities can be envisaged; for example, the active layer A might be deposited directly on the first barrier layer B1, the organic layer O being interposed between said active layer and the second barrier layer; or also the encapsulation structure can comprise two intercalated organic layers, respectively between the inorganic layers B1 and A, on the one hand, and A and B2, on the other hand; these two alternative forms are more complex to implement as the processes have to be carried out under an inert atmosphere. It is also possible to produce more complex stacks comprising several repetitions of the units A-B2 (this possibility is represented by the symbol "×n" in FIG. 1), indeed even O-A-B2 (this possibility is represented by the symbol "×m" in FIG. 1) and/or A-O-B2. What is important is that the multilayer structure comprises a stack comprising at least one active layer made of nonstoichiometric oxide with an oxygen deficiency and an organic planarization layer, said stack being confined between two inorganic and nonmetallic barrier layers prepared by ALD.

A multilayer "functional" layer or structure F can be deposited above the upper barrier layer in order to carry out any function useful to the device; the structure F can comprise, for example, a layer for protecting from scratches and/or a colored filter and/or an antireflective treatment, and the like. It is optional.

In FIG. 1, the multilayer encapsulation structure appears to completely cover the component C. In practice, however, some nonsensitive parts of the component can be bare, in particular electrical contacts allowing said component to be supplied. This bearing can be obtained by selectively depositing the different layers, for example using a stencil or mark, or by etching after deposition.

The performances of an encapsulation are typically defined by the water vapor transmission rate (WVTR) measured in $g/m^2/h$. This indicator is typically measured in a humid oven with an atmosphere which makes it possible to accelerate the failure of the barrier structure. Furthermore, an indicator called "lag time" is defined which measures the time necessary for the appearance of the first defect. These two indicators are typically established by the "calcium test" method, which consists in measuring the oxidation of a calcium block deposited under the barrier layer. This measurement is generally carried out via the electrical resistivity or the optical transparency.

However, another indicator more representative in the industrial context is the rate of failure of the devices initially free from defects, after an indicated time in a humid oven. This indicator is an indirect measurement of the two indicators discussed above (WVTR and lag time). It has the advantage of being able to be determined over a complete structure comprising the OLED layers and also the substrate.

An encapsulation structure according to the invention was tested by measuring the rate of failure of OLED screens exhibiting the following characteristics:
  silicon substrate comprising a metallization layer and a pixelated anode with a pixel size of the order of 5 μm;
  the sensitive components to be encapsulated are OLEDs composed of stacks: pixelated metal anode/OLED stack of organic layers/metal cathode, capping layer made of $SiO_x$ (intended to promote the extraction of light);
  the encapsulation is of the type illustrated in FIG. 1 but without a functionalization layer F. More particularly:
    the first barrier layer B1 consists of 20-30 nm of $Al_2O_3$ and is deposited by ALD;
    the organic planarization layer, O consists of 300 nm of a photosensitive resin deposited by spin coating. The photosensitivity of the resin will be made use of subsequently, by exposing it to light and by developing it in order to bare the electrical contacts and the cutting region.

The active layer of nonstoichiometric oxide A is made of $SiO_x$ with x approximately 1 (exact value of "x" not known but between 0.8 and 1.2) deposited by vacuum PVD. It is never brought into contact with atmosphere. For the purpose of comparison, two different thicknesses of this layer: 25 nm and 100 nm, are considered.

The second barrier layer B2 itself also consists of 20-30 nm of $Al_2O_3$ and is deposited by ALD.

By way of reference, screens in which the screens in which the layer of nonstoichiometric oxide A was not deposited were also considered. This is thus an encapsulation of conventional "SHB" type.

Tests were carried out on sheets each comprising 288 potentially usable screens. These sheets were initially tested in an automated fashion by taking a photograph of each screen. These photographs were sorted using software in order to determine the sample of each sheet, that is to say the screens not exhibiting any defect initially.

The sheets were subsequently subjected to a controlled atmosphere in a humid oven (60° C./90% humidity) by periods of 168 h, all the sheets being subjected to the atmosphere within the same oven.

At each period of 168 h in the oven, the sheets were again tested by taking a photograph of each screen and by then sorting these photographs in order to detect the defects. The aim in particular was to locate the defects of black spot type (nonemissive regions) which are characteristic of defects brought about by the penetration of water through the encapsulation.

The results of the sorting were compared in order to quantify the number of screens which have developed a defect during the aging, that is to say the screens for which the encapsulation exhibited failure.

Figure 2:
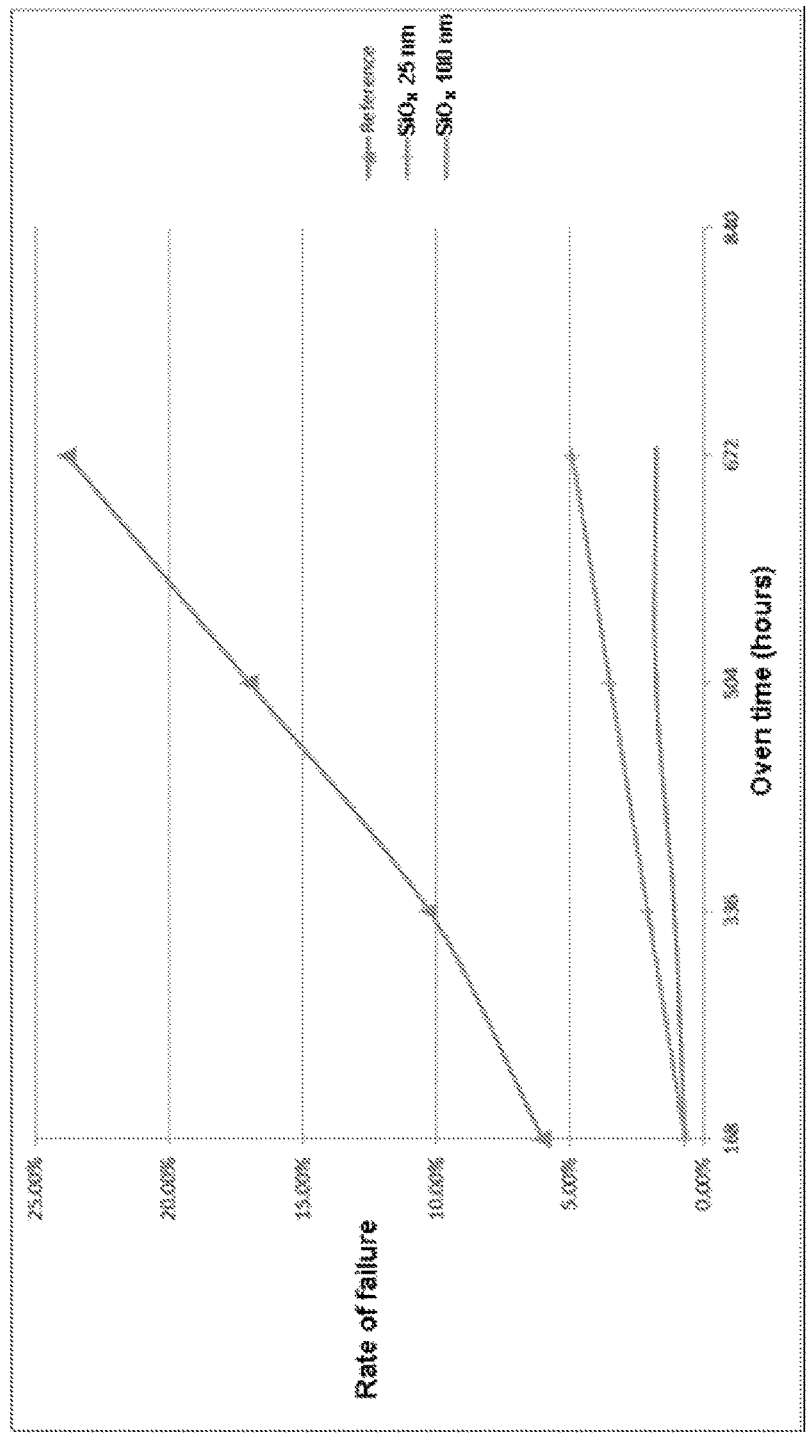
FIG. 2, a graph illustrating the rates of failure as a function of the time of encapsulated OLED screens in accordance with the invention and with the prior art.

These results are presented in FIG. 2. It may be noticed that the addition of a very thin layer (25 nm) of nonstoichiometric oxide with an oxygen deficiency very substantially improves the protection provided by an SHB stack, reducing the rate of failure approximately by a factor of 5. Increasing the thickness of this layer to 100 nm provides an additional improvement, significant especially for long oven times (greater than 500 h).

The invention claimed is:

1. An encapsulated device comprising:
   an organic optoelectronic component exhibiting at least one sensitive surface protected from oxygen and/or from water vapor; and
   a multilayer encapsulation structure covering said sensitive surface, comprising at least one layer comprised of organic material interposed between a first and a second barrier layer comprised of nonmetallic inorganic material impermeable to oxygen and to water vapor;
   wherein said barrier layers comprise a material chosen from a stoichiometric metal oxide, stoichiometric silicon oxide and a silicon oxynitride and are produced by atomic layer deposition, and
   wherein said multilayer encapsulation structure further comprises at least one active layer, comprising a nonstoichiometric oxide exhibiting an oxygen deficiency, said active layer interposed between said first and said second barrier layer and produced by a technique chosen from plasma assisted chemical vapor deposition, physical vapor deposition and cathode sputtering.

2. The device as claimed in claim 1, wherein said active layer is deposited on said organic layer.

3. The device as claimed in claim 1, wherein said multilayer encapsulation structure comprises a plurality of active layer-barrier layer pairs produced above said first barrier layer, the structure terminating in said second barrier layer.

4. The device as claimed in claim 1, wherein said multilayer encapsulation structure is substantially transparent to visible light.

5. The device as claimed in claim 1, wherein said active layer contains a nonstoichiometric oxide exhibiting an oxygen deficiency of between 40% and 60%.

6. The device as claimed in claim 1, wherein said active layer contains at least one nonstoichiometric oxide exhibiting an oxygen deficiency chosen from:
$SiO_x$ with $0<x<2$; and
$MoO_x$ with $0<x<3$.

7. The device as claimed in claim 1, wherein said component is chosen from an organic light-emitting diode and an organic photovoltaic cell, is deposited on a substrate and comprises an active region, said sensitive surface being a surface of said active region positioned on the opposite side from said substrate.

8. A process for the encapsulation of an organic optoelectronic component exhibiting at least one surface, called sensitive surface, which has to be protected from oxygen and/or from water vapor, comprising the following stages:
  a) producing, by atomic layer deposition, on or above said sensitive surface, a first barrier layer made of a nonmetallic inorganic material impermeable to oxygen and to water vapor, chosen from a stoichiometric metal oxide, stoichiometric silicon oxide and a silicon oxynitride;
  b) depositing, on or above said first barrier layer, a stack of layers comprising at least one layer made of organic material and a layer, called active layer, containing a nonstoichiometric oxide exhibiting an oxygen deficiency, said active layer deposited by a technique chosen from: plasma assisted chemical vapor deposition, physical vapor deposition and cathode sputtering; and
  c) producing, by atomic layer deposition, on or above said stack of layers, a second barrier layer made of nonmetallic inorganic material impermeable to oxygen and to water vapor, also chosen from a stoichiometric metal oxide, stoichiometric silicon oxide and a silicon oxynitride.

9. The process as claimed in claim 8, wherein said step b) comprises an operation for the deposition of at least one nonstoichiometric oxide by a technique chosen from: plasma assisted chemical vapor deposition, physical vapor deposition and cathode sputtering.

10. The process as claimed in claim 8, wherein said step b) also comprises an operation for the deposition of at least one layer made of organic material by a technique chosen from: spin coating, inkjet printing, chemical vapor deposition or physical vapor deposition.

11. The process as claimed in claim 8, wherein said component is chosen from an organic light-emitting diode and an organic photovoltaic cell, is deposited on a substrate and comprises an active region, said sensitive surface being a surface of said active region positioned on the opposite side from said substrate, and also electrical contacts, said steps a) to c) being carried out by selective deposition operations so that said electrical contacts are not covered by said layers.

12. An encapsulated device comprising:
  an organic optoelectronic component exhibiting at least one surface, called sensitive surface, which has to be protected from oxygen and/or from water vapor; and
  a multilayer encapsulation structure covering at least said sensitive surface, comprising at least one layer made of organic material interposed between a first and a second barrier layer made of nonmetallic inorganic material impermeable to oxygen and to water vapor;
wherein:
said barrier layers are made of a material chosen from a stoichiometric metal oxide, stoichiometric silicon oxide and a silicon oxynitride and produced by atomic layer deposition, and wherein
said multilayer encapsulation structure also comprises at least one layer, called active layer, containing a nonstoichiometric oxide of silicon $SiO_x$ wherein x is comprised between 0.8 and 1.2, also interposed between said first and said second barrier layer.

* * * * *